United States Patent
Cachina et al.

(10) Patent No.: US 6,900,393 B1
(45) Date of Patent: May 31, 2005

(54) SOLDER-BEARING WAFER FOR USE IN SOLDERING OPERATIONS

(75) Inventors: Joseph S. Cachina, Warwick, RI (US); James R. Zanolli, North Smithfield, RI (US)

(73) Assignee: Teka Interconnections Systems, Inc., Warwick, RI (US)

( * ) Notice: Subject to any disclaimer, the term of this patent is extended or adjusted under 35 U.S.C. 154(b) by 455 days.

(21) Appl. No.: 10/019,507

(22) PCT Filed: Sep. 20, 2000

(86) PCT No.: PCT/US00/26160

§ 371 (c)(1), (2), (4) Date: Mar. 29, 2002

(87) PCT Pub. No.: WO01/22785

PCT Pub. Date: Mar. 29, 2001

Related U.S. Application Data

(60) Provisional application No. 60/154,771, filed on Sep. 20, 1999.

(51) Int. Cl.$^7$ .................................................. H05K 1/16
(52) U.S. Cl. .................... 174/260; 174/255; 174/262; 174/263; 228/56.3; 438/876; 29/832
(58) Field of Search ............................. 174/255, 260, 174/261, 262, 263, 251, 253; 29/832, 840; 228/180.1, 245, 180.21, 56.3, 123.1, 246, 254, 180.22; 439/82, 83, 79, 876, 65; 257/779, 697

(56) References Cited

U.S. PATENT DOCUMENTS

| | | | |
|---|---|---|---|
| 4,684,055 A | | 8/1987 | Baer et al. |
| 4,807,799 A | | 2/1989 | Myong et al. |
| 5,210,940 A | * | 5/1993 | Kawakami et al. ........... 29/852 |
| 5,216,807 A | * | 6/1993 | Yoshizawa et al. ........... 29/876 |
| 5,986,338 A | | 11/1999 | Nakajima |
| 6,080,936 A | * | 6/2000 | Yamasaki et al. ........... 174/263 |
| 6,112,001 A | | 8/2000 | Kishida et al. |
| 6,119,920 A | | 9/2000 | Guthrie et al. |

* cited by examiner

*Primary Examiner*—Kamand Cuneo
*Assistant Examiner*—I B Patel
(74) *Attorney, Agent, or Firm*—Darby & Darby

(57) ABSTRACT

A solder bearing—bearing wafer (100) is provided which is used to connect a first electronic device to a second electronic device. The wafer includes a substrate body having a first surface and second surface, opposing the first surface. The first surface has grooves (115, 117) formed therein and includes length of solder (130) dispersed within groove. Upon heating the solder and placement of the wafer between the first and second devices, the two devices are connected.

30 Claims, 6 Drawing Sheets

SOLDER-BEARING WAFER FOR USE IN SOLDERING OPERATIONS

CROSS-REFERENCE TO RELATED APPLICATIONS

This application is a U.S. national phase application under 35 U.S.C. § 119 based upon co-pending International Application NO. PCT/US00/26160 filed Sep. 20, 2000, which claims the benefit of priority of U.S. Provisional Application Ser. No. 60/154,771 filed Sep. 20, 1999. The entire disclosures of the prior applications are incorporated herein by reference. The international application was published in the English language on Mar. 29, 2001 under Publication No. W001/22785.

FIELD OF THE INVENTION

The present invention relates to the field of devices for joining connectors or other electrical components to one another and, more particularly, to a method and apparatus for facilitating the soldering of first electronic devices, such as connectors, to second electronic devices such as printed circuit boards.

BACKGROUND OF THE INVENTION

It is often necessary and desirable to electrically connect one component to another component. For example, a multi-terminal component, such as a connector, is often electrically connected to a substrate, such as a printed circuit board, so that the terminals of the component are securely attached to contact pads formed on the substrate to provide an electrical connection therebetween. One preferred technique for securely attaching the component terminals to the contact pads is to use a solder material around a particular area, such as a hole, which typically receives one component terminal. Often, the component terminals may be in the form of conductive pins which are received within the holes formed in the substrate. The solder material, e.g., solder paste, is generally applied around each contact hole and then heated after the conductive pin is received within and extends through the contact hole. The heating of the solder paste causes the solder paste to flow around the conductive pin and the contact hole. The cooling of the solder paste results in the conductive pin being securely attached to one of the contact pads formed on the substrate.

While the use of solder paste is effective in some applications, there are a number of applications in which the use of solder paste is not desirable due to a number of factors, including but not limited to the design of both the component terminals and the substrate itself. In addition, the use of solder paste generally does not provide a sufficient volume of solder to properly join the component terminals and the contact pads.

One alternative approach to the use of solder paste is described in U.S. Pat. No. 5,875,546, which is assigned to the assignee hereof and which is incorporated by reference in its entirety. The device set forth in this reference comprises an array of solder-holding clips which is readily applied manually or by automation to a corresponding array of connector or other component terminals. The clips are typically formed by a die stamping operation which results in an increase in cost and complexity of the overall soldering operation.

It is therefore desirable to provide an alternative device and method for applying solder to connectors or the like.

SUMMARY OF THE INVENTION

According to a first embodiment, a solder-bearing wafer is provided for use in a soldering operation. The solder-bearing wafer is designed to provide a solder material which is used in a soldering operation for electrically connecting a first electronic device to a second electronic device. The solder-bearing wafer may be formed of a number of materials and preferably, the solder-bearing wafer is formed of a nonconductive material. For example, the solder-bearing wafer may be formed of a thermoplastic, a thermoset plastic, etc. The solder-bearing wafer has a plurality of through holes formed therethrough to facilitate the soldering of electrical terminals or contacts of the first electronic device. In one exemplary embodiment, the electrical terminals or contacts comprise pins which extend outwardly from the first component. Preferably, the first electronic device comprises an electronic connector and the second electronic device comprises a printed circuit board.

Typically, the contacts of the first electronic device comprise conductive pins. The pins of the first electronic device are usually arranged in some type of pattern across the surface of the first electronic device. For example, a traditional first electronic device may have a number of rows and columns of pins which are designed to provide a method of electrically connecting terminals of the first electronic device to electrical contacts disposed within the second electronic device, e.g., a printed circuit board. Accordingly, the wafer includes pin holes whose location and spacing correspond to the location and spacing of the pins of the first electronic device. This permits the wafer to mate with the first electronic device such that the pins are received within and extend through the pin holes of the wafer. The wafer is thus disposed between the first and second electronic devices.

According to the present invention, the wafer also includes a plurality of through holes formed th rough. The through holes are formed in rows on either side of each pin hole. The wafer further includes grooves running parallel to, and above and below, each row of pin holes. The length of each of the grooves is intersected at evenly spaced intervals by the through holes. Preferably and according to this one exemplary embodiment, the grooves are formed on only a single surface of the wafer.

A length of solder mass which generally conforms to the shape of one groove is secured in one of the grooves. In other words, the solder length is laid within the groove. Because there are a multiplicity of grooves, there are also a multiplicity of solder lengths extending across the surface of the wafer. A press or die thereafter severs the solder lengths at each through bole. At this point, the wafer contains pin holes having a solder segment located above and below each pin hole. Preferably, the solder segments are disposed between the next adjacent through holes.

The pin heads of the first electronic device are thereafter inserted into the pin holes of the wafer such that the pins emerge on the side of the wafer bearing the solder segments. The side of the wafer bearing the solder segments is then placed against a printed circuit board and the solder is heated and reflows thus securing the electronic device to the printed circuit board. The wafer remains disposed between the securely attached first electronic device and the printed circuit board. This first application of the present invention involves the use of the present solder-bearing wafer with through hole devices, such as the previously-described printed circuit board. Through hole devices are those devices which include a number of holes formed therethrough for receiving another conductive member, such as conductive pins. It will be appreciated that the wafer may be used with a number of other through hole devices besides printed circuit boards.

According to another embodiment of the present invention, the first electronic device, e.g., a connector, may have the solder holding features of the wafer incorporated directly into the design of the first electronic device. In this instance, a plurality of solder grooves are formed in a surface of the first electronic device so that rows of the conductive pins are disposed between a first groove row and a second groove row. It will be appreciated that this surface is preferably formed of a non conductive material, e.g., a thermoplastic material, which permits the grooves to be easily formed therein. Solder material is deposited into each solder groove resulting in each pin having one solder segment on one side thereof and another solder segment on an opposite side thereof. Similar to the first embodiment, the formation of grooves serves to limit and define the amount of solder material which is used for the soldering of one pin to a respective surface of the second electronic device. This reduces or eliminates the risk that a single large mass of solder will result when the solder segments are heated and reflow. In this embodiment, the first electronic device incorporates the attributes of the wafer of the first embodiment and therefore it is not necessary to use the wafer to provide solder material for the soldering of the two devices.

While the first two embodiments of the wafer are intended for use when the second electronic device is a through hole type device, another embodiment of the wafer of the present invention is intended for use in surface mount type applications. In these applications, planar contacts of the first electronic device are generally disposed flush against a planar contact surface of the second electronic device to produce an electrical connection therebetween. For example, the first electronic device may comprise a connector referred to as a straddle mount device in which contacts in the form of fingers seat against respective contact pads formed in the second electronic device. In this embodiment, the wafer also includes solder lengths provided in respective and complementary grooves formed in the wafer. The solder lengths are severed to form distinct solder segments where one or more solder segments are for the soldering of one contact to one contact pad.

The wafer is disposed against the first electronic device and more specifically, the wafer extends across the contact fingers thereof such that one or more of the solder segments are disposed over one contact finger. Accordingly, the heating of the solder segments causes the reflowing thereof and because the contacts are preferably formed of a solderable material, the contacts are securely soldered to the respective contact pads providing a secure electrical connection between the first and second electronic devices. Because the wafer includes through holes as in the first embodiment, the solder lengths are severed into the solder segments and therefore a predefined amount of solder material is used in the soldering of one contact to one contact pad.

This embodiment of the wafer of the present invention provides a wafer which may be used in a variety of surface mount applications. For example, not only may the wafer be used to electrically connect a straddle mount device to a printed circuit board, it may also be used in applications where it is necessary to electrically connect one planar surface to another planar surface of another electronic device.

BRIEF DESCRIPTION OF THE DRAWINGS

Objects and features of the present invention will be described hereinafter in detail by way of certain preferred embodiments with reference to the accompanying drawings, in which.

DETAILED DESCRIPTION OF THE PREFERRED EMBODIMENT

Figure 1:
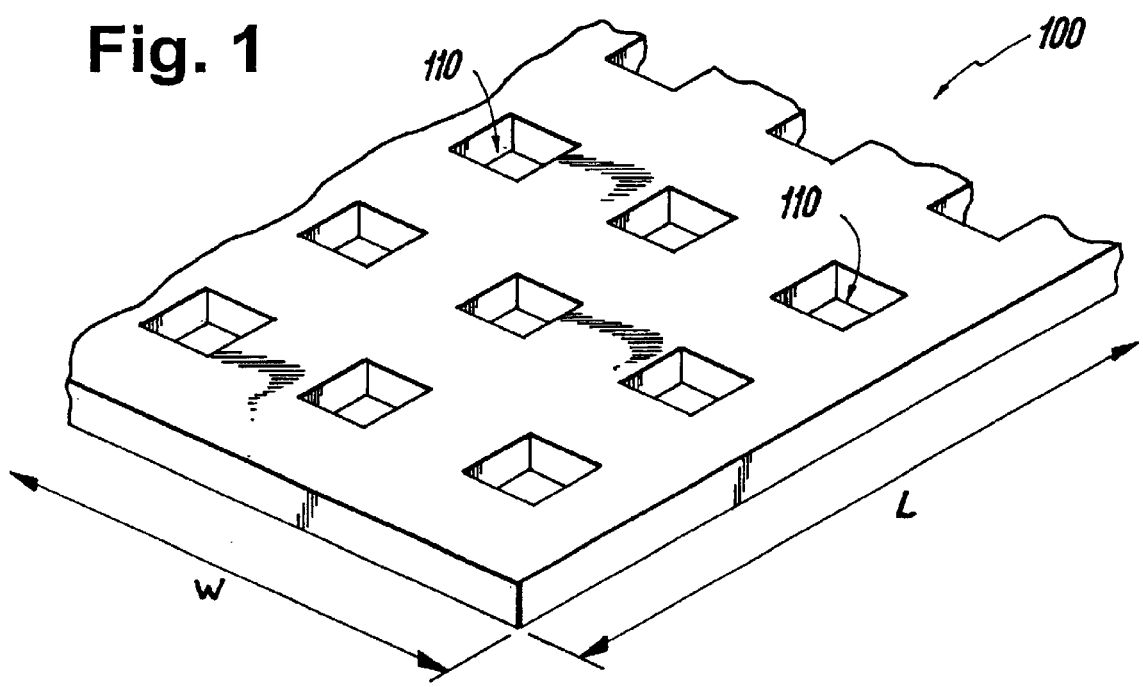
FIG. 1 is a top perspective view of a wafer with pin holes located therethrough.
Figure 2:
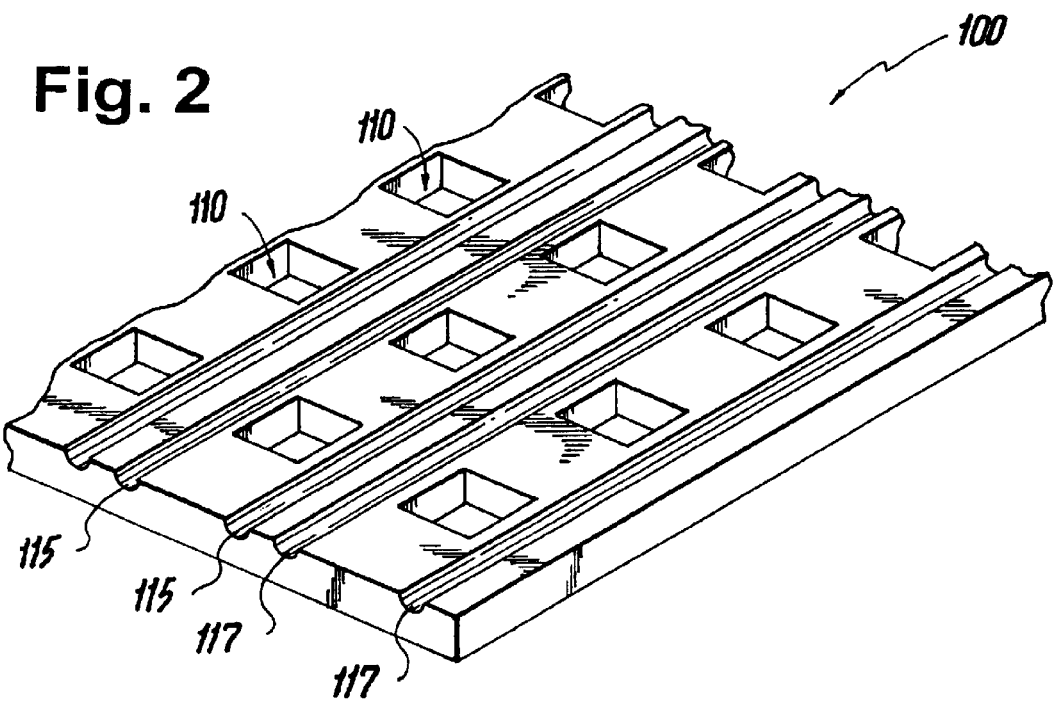
FIG. 2 is a side perspective view of the wafer of FIG. 1.
Figure 3:
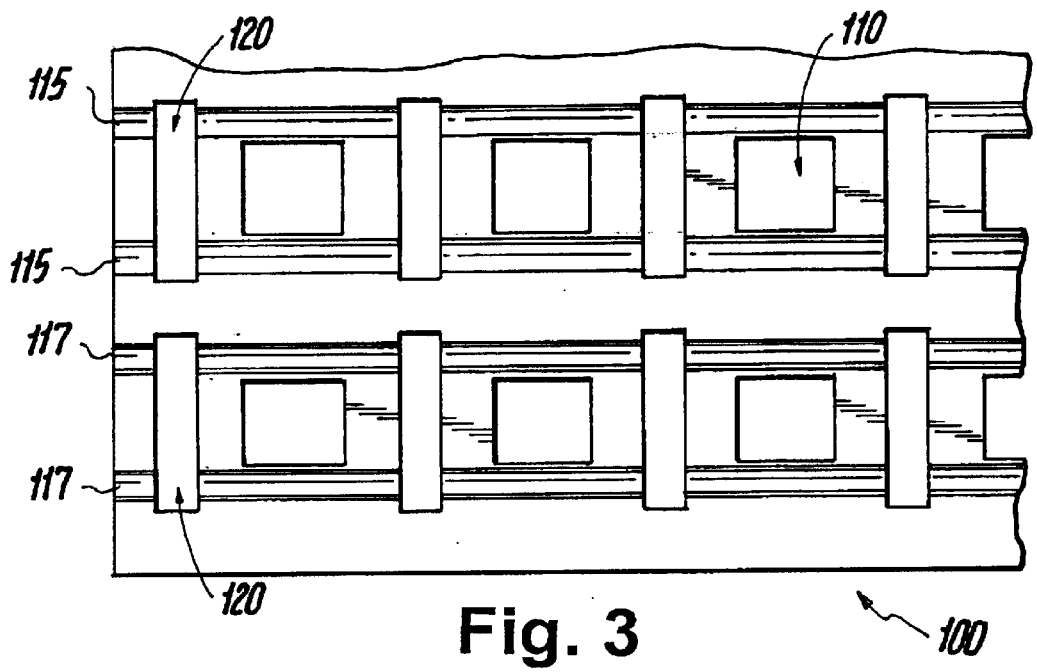
FIG. 3 is a top view of the wafer of FIG. 1 additionally having solder-holding grooves formed thereon.

In one aspect, the present invention facilitates the process of soldering electrical terminals or contacts of one electronic device to a surface of a second electronic device using a solder-bearing wafer. In one exemplary embodiment, the electrical contacts comprise conductive pins and the second electronic device comprises a printed circuit board. FIGS. 1 through 3 illustrate a method of forming a wafer according to a first embodiment of the present invention.

Figure 7:
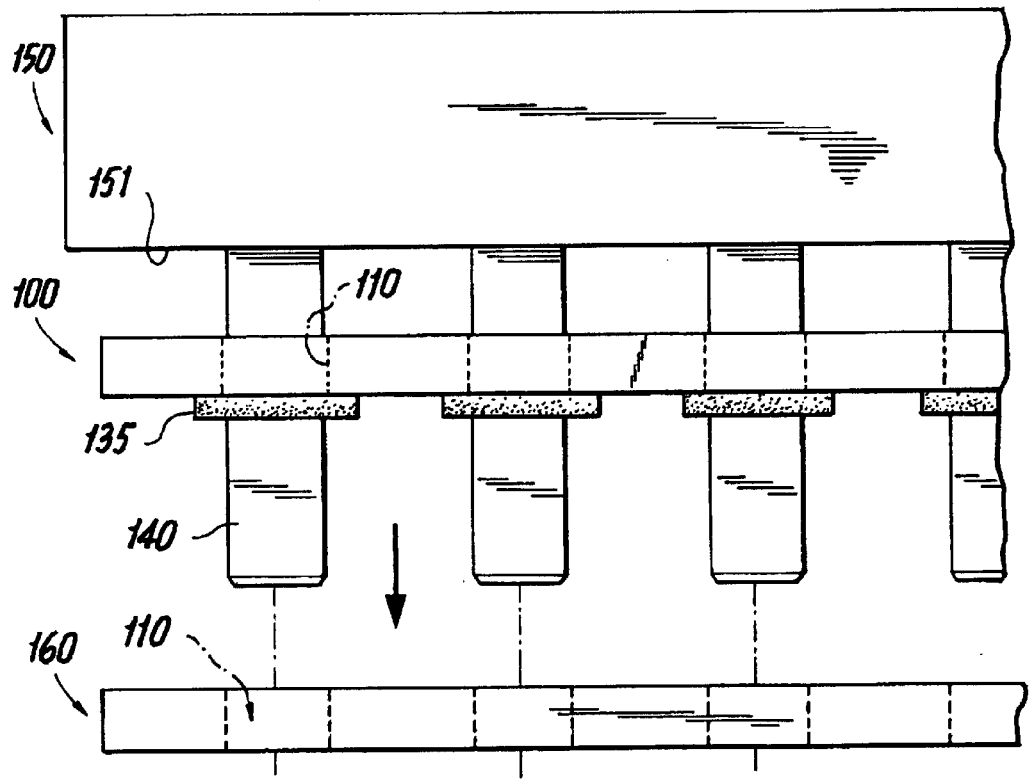
FIG. 7 is a side view of the wafer of FIG. 6 having the pins of an electronic device placed through the respective pin holes of the wafer.

Turning to FIG. 1, a wafer 100 is provided and is formed of any number of suitable material and preferably is formed of a non-conductive material. For example, the wafer 100 may be formed of a thermoplastic material, thermoset plastic, etc. The wafer 100 has pin holes 110 formed therethrough. It will be appreciated that pin hole 10 does not necessarily have to have an annular shape and pin hole 10 generally comprises small holes formed in the wafer 10. The location and general spacing of pin holes 110 are determined by the location and spacing of pins of a first electronic device (FIG. 7) to be mounted onto a second electronic device, e.g., a printed circuit board (FIG. 7). It will therefore be appreciated that the pin holes 110 may be arranged according to any number of patterns depending upon the number of pin holes 110 and the location thereof. In the embodiment shown in FIG. 1, the pin holes 110 are arranged in horizontal rows along a first axis and vertical columns along a second axis and are spaced a predetermined distance apart from one another. The first axis extends generally across a length, L, of the wafer 100 and the second axis extends generally across a width, W, of the wafer 100. The first axis is thus preferably longer than the second axis. The pin holes 110, for example, are spaced a predetermined amount center-to-center along the first axis and a predetermined amount along the second axis to accommodate an electrical device having pins that are correspondingly spaced.

Furthermore, the length and width of the wafer 100 generally conform to the length and width of the first electronic device to be mounted onto the second electronic device. The depth or thickness of the wafer 100 is preferably about 0.030 inches. However, this measurement is merely for purpose of illustration.

The pin holes 110 may be formed through the wafer 100 using any of the methods known in the art, including, e.g., the use of a stamping die. Alternately, the pin holes 110 can be formed or molded during manufacture of the wafer 100.

Turning to FIG. 2, therein is illustrated a side perspective view of the wafer 100 where two pairs of the grooves 115 and 117 can be seen extending along the first axis of the wafer 100 on either side of each row of the pin holes 110. Although the grooves 115 and 117 are shown as having a half-cylindrical shape, it is understood that the shape of the grooves 115 and 117 may be any shape. Preferably, the shape of the grooves 115 and 117 conforms to the shape of a solder length 130 (FIG. 4) which, as will be described more fully below, is to be inserted in each of the grooves 115 and 117.

The grooves 115 and 117 are formed in the wafer 100 using any of the methods known in the art, including, e.g., the use of an etching or a stamping die. Alternately, the grooves 115 and 117 can be formed during manufacture of the wafer 100. For example, the grooves 115 and 117 may be used during a molding process which is used to manufacture the wafer 100. The grooves 115 and 117 may be formed on the wafer 100 before, during or after the placement of the pinholes 110.

Turning to FIG. 3, therein is illustrated the wafer 100 having the through holes 120 located therethrough along the first axis so that at least one through hole 120 is located on either side of each pin hole 110. As is shown, each through hole 120 extends sufficiently along the second axis to encompass one of grooves 115 and 117, respectively. The through holes 120 are formed on the wafer 100 using any of the methods described above for forming the pin holes 110 and the grooves 115 and 117.

Figure 4:
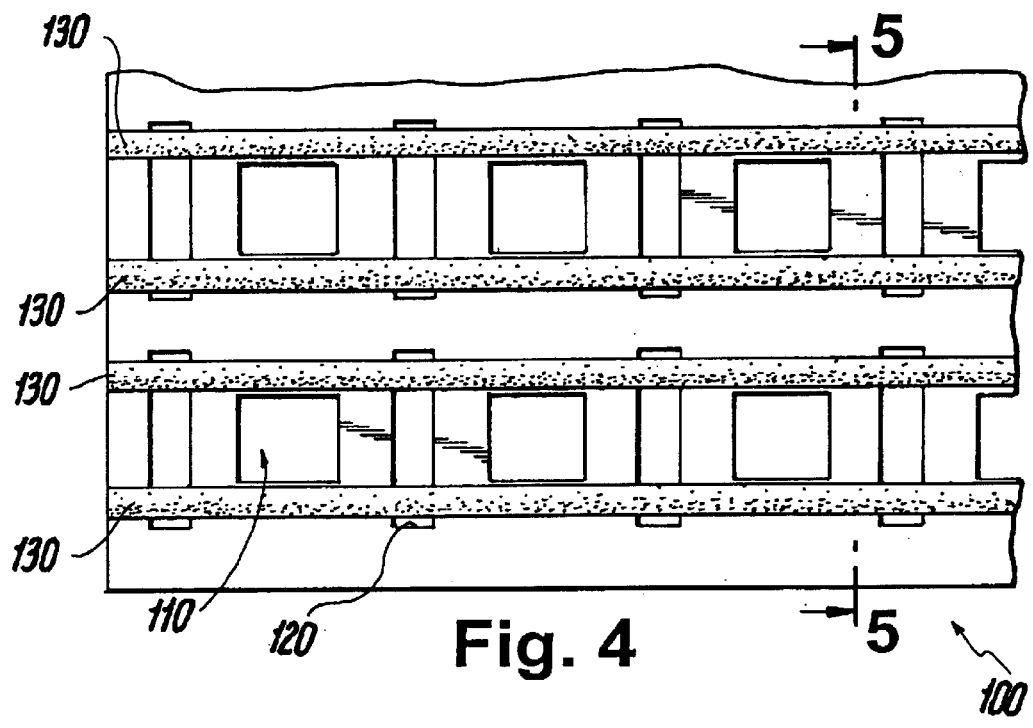
FIG. 4 is a top view of the wafer of FIG. 3 additionally having through holes located therethrough.
Figure 5:
FIG. 5 is a cross section view of the wafer of FIG. 4 taken along line 55.
Figure 6:
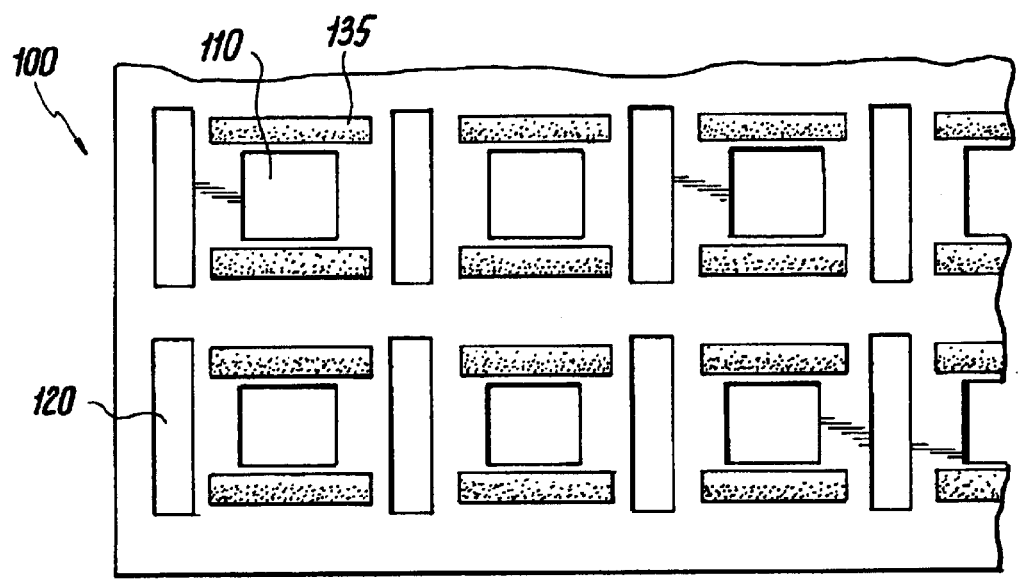
FIG. 6 is a top view of the wafer of FIG. 5 wherein the solder-holding lengths have been partitioned.

According to the present invention, solder segments 135 are added to the wafer 100 for providing a solder material used to securely attach the first and second electronic devices to one another, as will be described hereinafter. FIGS. 4 through 6 illustrate the method of adding solder segments 135 to the wafer 100.

Turning to FIG. 4, and 5 therein is illustrated the wafer 100 having solder lengths 130 placed in the grooves 115 and 117. The solder lengths 130 include any of the soldering compositions known in the art and are preferably shaped to be inserted form fittingly and securely within the grooves 115 and 117. In other words, the solder lengths 130 preferably comprise elongated strips of solder material which are shaped complementary to the grooves 115 and 117. Accordingly, in the present example, as particularly illustrated and shown in FIG. 5, the solder lengths 130 are cylindrically shaped so as to fit securely within the half-cylindrical shaped grooves 115 and 117 as in FIG. 2.

With continued reference to FIG. 4, it is shown that each pair of solder lengths 130 lie across a row of through holes 120. In this way, a press or stamp having dies shaped and spaced in conformance with the shape and position of through holes 120 on wafer 100 is used to sever solder lengths 130 at each of the through holes 120.

FIG. 6 illustrates the wafer 100 after the solder lengths 130 are severed as described above to form a plurality of solder segments 135. As is shown, each pin hole 110 has one solder segment 135 located on either side of the pin hole 110. Because each solder segment 135 is held securely by the groove 115 or 117, the wafer 100 can be held in any position required to conform to a particular manufacturing process or machinery being used (e.g., solder side facing-up, facing sideways, facing downward, etc.).

FIG. 7 illustrates an electronic device 150 having pins 140 extending from a first surface 151 thereof. The first electronic device 150 may comprise any number of suitable devices which are intended to be electrically connected to a second electronic device 160. For example and according to one exemplary embodiment, the first electronic device 150 comprises an electrical connector and the second electronic device 160 comprises a printed circuit board (through hole type device). The pins 140 comprise conductive pins which serve to establish an electrical connection between terminals (not shown) of the first electronic device 150 and corresponding electronic components of the second electronic device 160. The pins 140 are placed into respective pin holes 110 of the wafer 100. As shown in FIG. 7, the wafer 100 is positioned such that the solder segments 135 face downwards. Solder segments 135 are held in place by their form fitting interconnection with grooves 115 and 117.

Once the first electronic device 150 and the pins 140 have been inserted a sufficient distance into the wafer 100 and the pin holes 110, the side of the wafer 100 having solder segments 135 exposed may be placed onto the second electronic device 160 having pin holes 110 conforming to the spacing and size of the pin holes 110. The solder segments 135 are thereafter heated causing the solder segments 135 to reflow around the pins 140 and the pin holes 110 along with other surfaces of the second electronic device 160. As the solder segments 135 cool, the pins 140 are secured to the second electronic device 160 resulting in a secure electrical connection between the first and second electronic devices 150, 160. After the reheating and cooling of the solder segments 135, the wafer 100 remains soldered between the first electronic device 150 and the second electronic device 160. It being understood that the solder segments 135 are heated after the first and second electronic devices 150, 160 have been brought together.

Referring now to FIGS. 1 through 7. It will be appreciated that the provision of through holes 120 to permit the severing of solder lengths 130 also serves to define an amount of solder material around each of the pins 140. In other words, by providing two solder segments 135 adjacent to each of the pin holes 110, a defined amount of solder material is dedicated for the soldering of one pin 140 to a corresponding section of the second electronic device 160. The severing of the solder lengths 130 reduces the mass of solder material used in the solder operation which results in a decreased chance that a large soldered mass will result during the heating process. In addition, the severing of the solder lengths 130 also prevents adjacent contact sites from being starved. In other words, often the heating of contacts is not uniform and one contact (pin 140) will be heated greater and actually draws solder material from one or more adjacent sites. This causes the one or more adjacent contacts to be starved of the solder material and results in ineffective soldering of these contacts. By placing a defined amount of solder material around each pin 140, the solder material is effectively divided into local segments which are used for the soldering of one respective pin 140. Accordingly, the heating process produces distinctly spaced, soldered masses around the pins 140 rather than a single large soldered mass and the solder station sites associated with conventional techniques are eliminated.

The solder-bearing wafer 100 of the present invention overcomes many of the deficiencies associated with the devices of the prior art. First, the wafer 100 has a relatively simple yet effective design. Because the solder carrier medium is a thermoplastic material, conductive material will not remain attached to the contacts (pins 140) after the solder segments 135 reflow. Second, thermoplastic materials are typically less costly than the metal materials used to produce other soldering aid devices. Third, this results in reduced manufacturing costs and as simplicity of the present invention permits an operator to more easily and more quickly apply the wafer 100 to the first electronic device 150. Fourth, the wafer 100 also provides increased solder volumes by forming the solder segments 135 within the grooves 115 and 117 around the respective pins 140. This increase in solder volume provides more solder material for each solder joint formed between the devices 150, 160, thereby improving the quality of each of the solder joints. Fifth, the present invention provides tighter lead spacing in that the contacts (pins 140) of the first electronic device 150 may be closer together than would have been possible if other solder aides were used. Sixth, the solder-bearing wafer 100 permits irregular solder patterns to be formed thereon. This permits the soldering segments 135 to be formed on the wafer 100 at desired locations. Thus, the location of the solder segments 135 may be customized depending upon the specific application and depending upon the configuration of one or more of the first and second electronic devices 150, 160.

Different variations of the solder-bearing wafer 100 are possible depending on the particular application. For example, only a single solder length 130 and single groove may be provided for each row of pin holes. Also, fewer or greater than two rows of pin holes 110 may be provided on wafer 100. Also, the through holes 120 may not be necessary if the solder lengths 130 are segmented in a way which allows removal of the solder portions in between the desired segments, e.g., by way of a cutting and vacuum removal process. Further, the pin holes, through holes and grooves may take on any necessary shape depending on the particular application.

It will be appreciated that the wafer 100 may be distributed in a number of forms. For example, if the specifications of a given application are known, the wafer 100 may be cut to have a desired length and width so that the wafer 100 is disposed between the first and second electronic devices 150, 160 without the wafer 100 extending beyond either of the first or second electronic devices 150, 160. The wafer 100 may also be rolled onto reels and then distributed to a number of connector/electrical component manufacturers for retrofit to their existing or future products. The design of the wafer 100 therefore permits versatility in that it may not only be custom manufactured for one specific application but it also permits the wafer 100 to be distributed in a basic form and then retrofitted by the purchaser.

Figure 8:
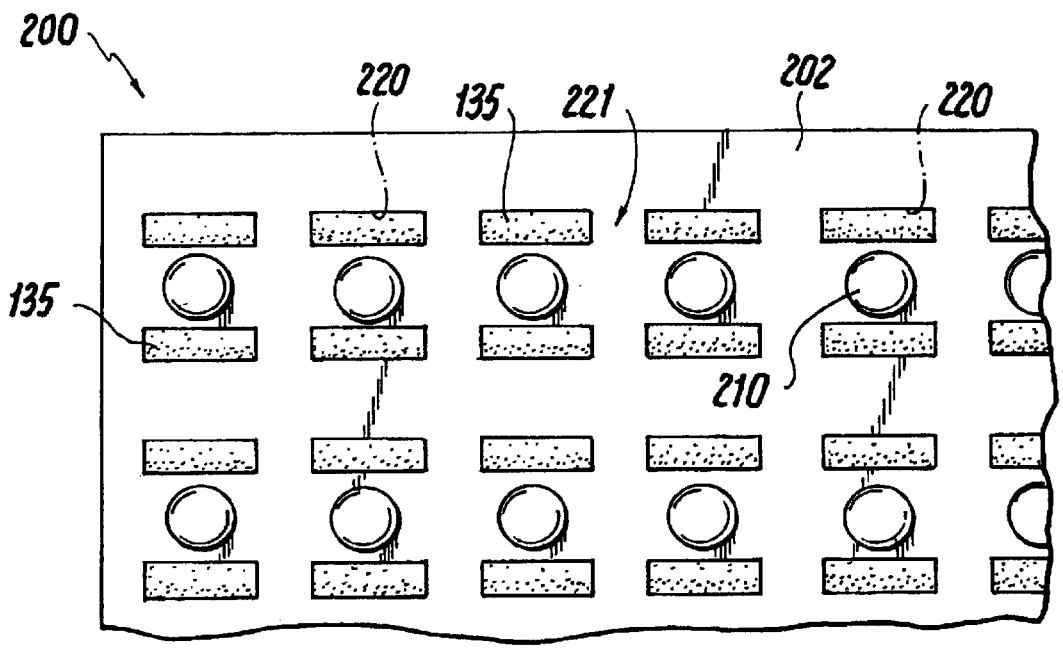
FIG. 8 is a bottom plan view of one exemplary electrical connector according to one embodiment of the present invention.

Now referring to FIG. 8 in which a first connector device according to a second embodiment of the present invention is illustrated and generally indicated at 200. The first connector device 200 is preferably an electrical connector which is designed to be electrically connected to another electronic device, such as the printed circuit board 160 shown in FIG. 7. The first connector device 200 is similar to the first electronic device 150 of FIG. 7 with the exception that the solder segments 135 are incorporated as part of the first connector device 200 rather than being provided on the wafer 100. In this embodiment, the wafer 100 is not used in the soldering of the first connector device 200 to the other electronic device.

As shown in FIG. 8, the first connector device 200 has a first surface 202 which faces the second electronic device when the two are soldered to one another. A plurality of pins 210 extend outwardly from the first connector device 200 and more specifically, the plurality of pins 210 extend away from the first surface 202. The plurality of pins 210 may be disposed across then first surface 202 according to any number of patterns and the row/column pattern shown in FIG. 8 is merely exemplary in nature. Furthermore, one will appreciate that the pins 140 may have any number of cross-sectional shapes and the circular cross-section shown is also merely exemplary.

According to the second embodiment, grooves 220 are formed across the first surface 202 similar to the first embodiment shown in FIGS. 1–7. The grooves 220 are designed to securely carry and locate solder material. In the exemplary embodiment, the grooves 220 extend horizontally across the first surface 202 with the grooves 220 being formed on either side of each row of pins 140. Similar to the first embodiment, the solder material is deposited as defined solder segments 135 into the grooves 220 formed in the first surface 202. Each pin 140 therefore has a solder segment 135 on one side thereof and another solder segment 135 on another side thereof. In one exemplary embodiment, the grooves 220 comprise a number of defined grooves 220 which extend along a common axis across the first surface 202. Each groove 220 therefore has a predetermined length and preferably all of the individual grooves 220 have the same length. The length of the grooves 220 will be determined by a number of factors including the size of the pins 140 and also the amount of the solder material which is to be deposited around the pin 140. It will be appreciated that in this embodiment, the grooves 220 are not in the form of single continuous grooves but rather comprise a number of spaced grooves 220 formed along a common axis with an ungrooved section 221 formed between adjacent grooves 220. The grooves 220 may be formed during the manufacture of the first connector device 200 or they may be formed by a subsequent operation, e.g., a stamping operation. Because the pins 140 act as conductive members, the first surface 202 of the first connector device 200 is preferably formed of a non-conductive material, such as a thermoplastic. This facilitates the formation of the grooves 220 as the grooves 220 may be formed in the first surface 202 during a molding process, or the like, which is used to form the first connector device 200.

After the grooves 220 are formed, the solder material is deposited therein so that a number of solder segments 135 are provided. The grooves 220 may be formed according to any number of known techniques. Each groove 220 defines one solder segment 135. As previously mentioned by forming two opposing grooves 220 around each pin 140, the amount of solder material for each pin 140 is generally defined as the amount of solder material being deposited within the two opposing grooves 220. By dividing the solder material into two distinct solder segments 135 around each pin 140, the likelihood that a single solid solder mass will result during reflowing of the solder material is reduced or eliminated as well as the presence of solder starvation sites is likewise eliminated. Advantageously, the use of solder segments 135 permits the proper amount of solder material to be delivered to each pin 140 for the soldering of the pin 140 to the other electronic device, such as a printed circuit board.

In this embodiment, the wafer 100 of FIG. 1 is not used but rather the solder holding features are incorporated directly into the design of the first connector device 200. This simplifies the soldering operation by eliminating the use of the intermediate wafer 100. Instead, the first connector device 200 is directly mated with another electronic device, e.g., a through-hole device, which receives the pins 140 and which are then soldered to the through hole devices. It will also be appreciated that while the first connector device 200 has been described in terms of containing pins 140, the device 200 may contain planar or other shaped contacts instead of pins 140. The solder segments 135 are simply disposed around these planar or other shaped contacts for providing a solder and electrical connection between each contact and the second electronic device.

Figure 9:
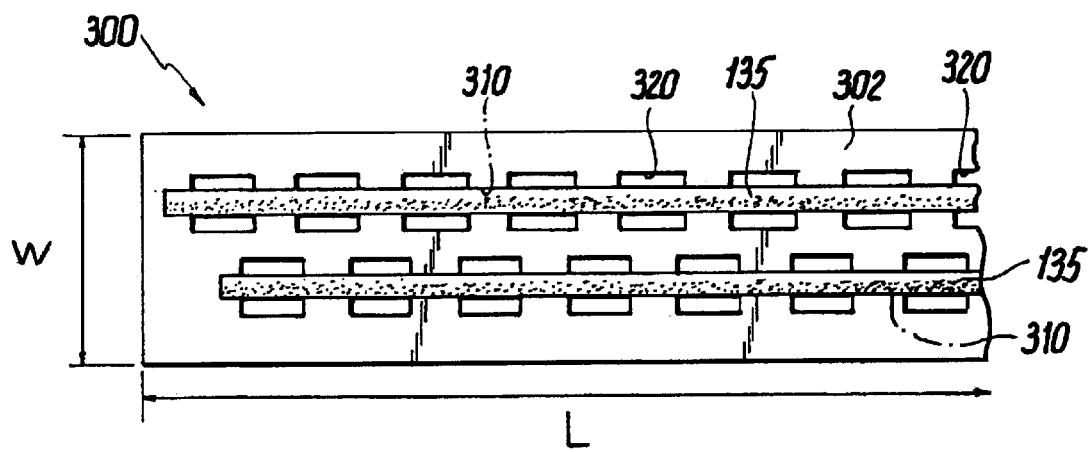
FIG. 9 is a top view of a wafer according to a second embodiment in which solder lengths are disposed within solder-holding grooves formed in the wafer.
Figure 10:
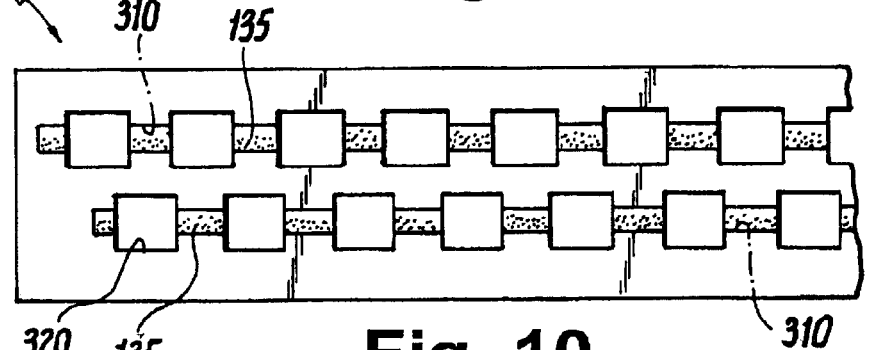
FIG. 10 is a top plan view of the wafer of FIG. 9 wherein the solder lengths have been partitioned.

FIGS. 9 through 10 illustrate a method of forming a wafer according to a second embodiment.

Turning to FIG. 9 in which a wafer according to a second embodiment of the present invention is illustrated and generally indicated at 300. The wafer 300 has a length, L, and a width, W. For purpose of illustration, only a section of the wafer 300 is shown in FIGS. 9 and 10. As in the first embodiment, the wafer 100 is formed of a non-conductive material, such as a suitable thermoplastic or thermoset material. The wafer 100 has a predetermined number of grooves, generally indicated at 310, formed in a first surface 302 of the wafer 300. In the exemplary embodiment, the grooves 310 comprise longitudinal grooves extending along the length L of the wafer 300. The cross-sectional shape of the grooves 310 may be any shape and in one exemplary embodiment, each groove 310 has a half-cylindrical cross-sectional shape. The grooves 310 are formed in the wafer 300 using any of the methods known in the art, including, e.g., the use of an etching or a stamping die. Alternatively, the grooves 310 can be formed or molded during the manufacture of the wafer 300.

The wafer 300 also includes a plurality of through holes 320 formed in the wafer 300. The through holes 320 are formed at spaced locations along each groove 310. In other words, through holes 320 are formed directly within the groove 310. As shown in FIG. 9, solder lengths 130 are placed within each of the grooves 310. Solder lengths 130 are preferably shaped to be inserted form fittingly and securely within the grooves 310. In the present example, the solder lengths 130 are cylindrically shaped so as to fit securely within the half-cylindrical shaped grooves 310. Each solder length 130 lies across a row of through holes 320. In this way, a press or stamp having dies shaped and spaced in conformance with the shape and position of the through holes 320 on the wafer 300 are used to sever solder lengths 130 at each of the through holes 320.

FIG. 10 illustrates the wafer 300 after the solder lengths 130 (FIG. 9) are severed as described above. As is shown, a number of spaced solder segments 135 are formed. More specifically, one solder segment 135 is formed on either side of one through hole 320. The solder segments 135 are still securely fit within the grooves 310 after the performing the operation to form the solder segments 135. The solder segments 135 are thus axially aligned in rows extending along the length of the wafer 300 with one through hole 320 being formed between next adjacent solder segments 135.

While FIG. 9 shows a pair of grooves 310 and solder lengths 130, it will be understood that the wafer 100 may contain a single groove 310 and solder length 130 or the wafer 100 may include more than two grooves 310 and solder lengths 130. Furthermore, while the wafer 300 shown in FIG. 10, has solder segments 135 formed in a staggered pattern, it will be understood that the solder segments 135 may be axially aligned with one another in columns as shown in FIG. 11.

The formation of through holes 320 within the wafer 300 and the subsequent severing of the solder length 130 to form the solder segments 135 serve to define the amount of solder material in each of the solder segments 135. By limiting the solder material to distinct solder segments 135, the likelihood that a single solid solder mass will result during reflowing of the solder material is reduced or eliminated. In contrast, each of the specific points of contact between the first and second electronic devices (not shown) may be provided with a predefined amount of solder material.

Figure 11:
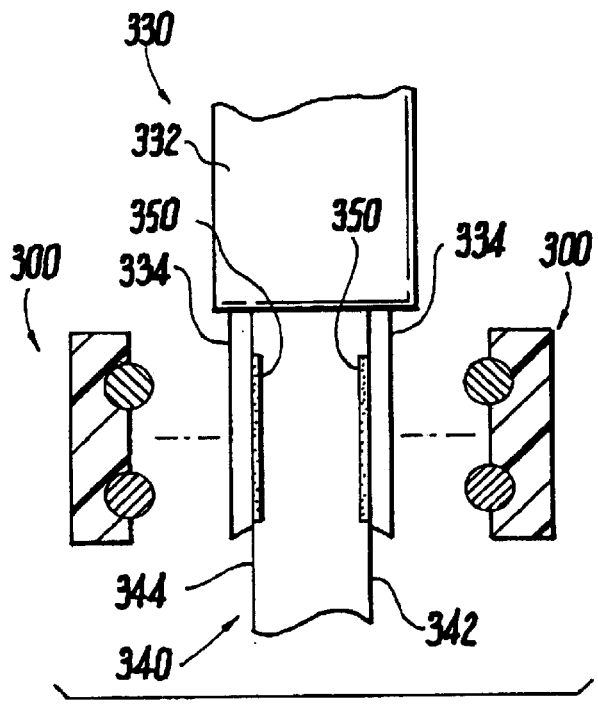
FIG. 11 is a side view of an assembly formed of a first electronic device coupled to a second electronic device with two wafers of FIG. 10 shown exploded therefrom.

FIG. 11 is a partially exploded side view showing a first electronic device 330 and a second electronic device 340. One exemplary first electronic device 330 comprises a connector and more particularly, the illustrated first electronic device 330 comprises a connector which is commonly referred to as a straddle mount device. The device 330 has a base portion 332 and a plurality of contacts 334 extending therefrom. The contacts 334 serve to provide an electrical connection between the first electronic device 330 and the second electronic device 340. In the illustrated embodiment, the contacts 334 comprise a number of elongated finger-like members which extend outwardly from the base portion 332. Typically, the contacts 334 are formed in opposing rows with a gap being formed between the rows of contacts 334. The contacts 334 are formed of a conductive material and preferably, the contacts 334 are formed of a solderable material which aides in the soldering of the first electronic device 330 to the second electronic device 340, as will be described in greater detail hereinafter. This type of contact 334 is also referred to as a solder tail based upon its physical appearance and its material characteristics.

The illustrated first electronic device 330 is referred to as a straddle mount device because the spaced rows of contacts 334 and the base portion 332 resemble a straddle structure. The first electronic device 330 is mounted to the second electronic device 340 by receiving the second electronic device 340 within the gap formed between the contacts 334. Preferably, the second electronic device 340 comprises a printed circuit board having a first surface 342 and an opposing second surface 344. The second electronic device 340 also has a predetermined number of surface mount contact pads 350 formed on each of the first and second surfaces 342, 344. These contact pads 350 provide contact surfaces where an electrical connection is made between the first and second electronic devices 330, 340 through the contacts 334 and the contacts pads 350. The contact pads 350 are therefore spaced along the second electronic device 340 in a complementary manner relative to the spacing of the contacts 334 so that when the first and second electronic devices 330, 340 mate with one another, the contacts 334 and contact pads 350 engage one another.

Figure 12:
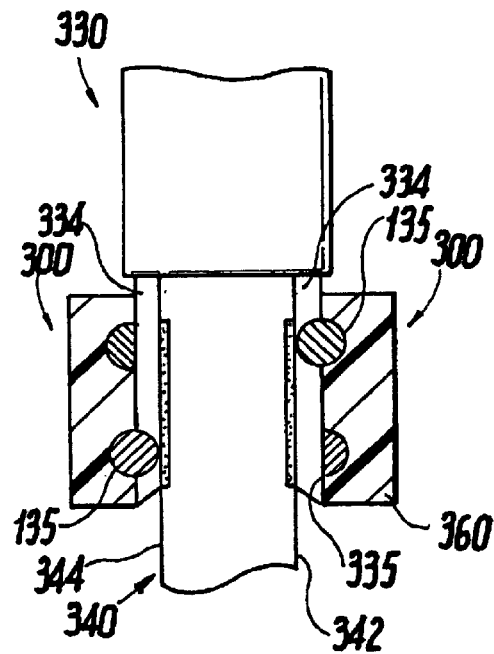
FIG. 12 is a side view of the assembly of FIG. 11 with the two wafers being applied to a portion of the first electronic device.

After the first electronic device 330 has been properly positioned relative to the second electronic device 340 such that the contacts 334 engage the contact pads 350, one or more wafers 300 are brought into contact with the second electronic device 340 as shown in FIG. 12. FIG. 12 illustrates a pair of wafers 300 being disposed against the contacts 334 of the first electronic device 330. Generally for each row of contacts 334, there will be one complementary wafer 300 used for soldering the first and second electronic devices 330, 340 to one another. More specifically, one wafer 300 is disposed against one row of contact 334 and another wafer 300 is disposed against the other row of contacts 334. When the wafers 300 are properly disposed against the contacts 334, the solder segments 135 are brought into contact with these contacts 334. In other words, one or more solder segments 135 seats against an outer surface 335 of one contact 334 and provides solder material for the soldering of the each contact 334 to one contact pad 350. In the illustrated embodiment, two solder segments 135 are provided for each contact 334. These two solder segments 135 when heated serve to solder one contact 334 to one contact pad 350. As with the other embodiments, by dividing the solder length 130 into solder segments 135, the amount of the solder material which is applied for the soldering of one contact 334 to one contact pad 350 may be controlled. This reduces or eliminates the risk of having a single solder mass form and extend across the surfaces of the first and second electronic devices 330, 340.

Figure 13:
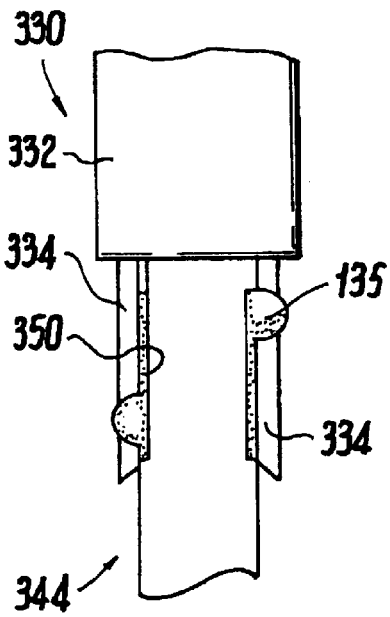
FIG. 13 is a side view of the assembly of FIG. 12 showing the first electronic device soldered to the second electronic device and the two wafers having been removed from the assembly.

Because the contacts 334 are preferably formed of a solderable material, the heat applied by the solder segments 135 and the reflowing action of the solder segments 135 themselves provide an effective solder connection between the contact 334 and the contact pad 350. This results in a secure electrical connection being formed between the first electronic device 330 and the second electronic device 340. Depending upon the specific application, the wafer 300 may or may not be removed from the first electronic device 330 during or after the reflowing of the solder material. FIG. 13 illustrates the instance where the wafer 300 has been removed leaving behind the contacts 334 securely soldered to the respective contact pads 350.

While the embodiment shown in FIGS. 9 through 13 illustrates the wafer 300 separate from the first electronic device 330, it is within the scope of the present invention that the first electronic device 330 may be designed so that the wafer 300 is incorporated therein or coupled thereto prior to attachment to the second electronic device 360. In one embodiment, the first electronic device 330, e.g., a straddle mount connector, is directly attached to the second electronic device 340 without using a separate wafer 300. Instead the first electronic device 330 has the wafer 300 formed as part thereof with each contact 334 having one more associated solder segments 135. The first and second electronic devices 330, 340 are securely attached to one another by simply inserting the second electronic device 340 between the contacts 334 so that the contacts 334 seat against the conductive pads 350 of the second electronic device 340. Heating action on the solder segments 135 causes reflowing of the solder material resulting in the contacts 334 being securely attached to the contact pads 350.

It will be appreciated that instead of being integrally formed with the first electronic device 330 (or first electronic device 150), the wafer 300 (or wafer 100) may be attached to the respective first electronic device by any number of techniques. For example, the wafer may have locking features which cooperate with complementary locking features provided on the first electronic device so as to securely attach the wafer to the first electronic device. The first electronic device may be marketed and distributed this way, namely with the wafer being attached and preferably detachably attached to the first electronic device to form an assembly. The assembly is then coupled to the respective second electronic device 160, 340 and then heated to cause the solder material to reflow and electrically connect the respective components.

The embodiment illustrated in FIGS. 9 and 10 provides an attractive alternative to using a ball grid array type device for surface mount lead type devices. As is known, ball grid array type devices generally comprise connector devices which have surface mountable ball grid arrays. The ball grid array is in the form of a plurality of solder balls arranged across an outer surface of the connector according to any number of patterns. One typical arrangement is for the solder balls to be arranged in a number of rows and columns. Upon heating, the solder balls reflow and create a soldering surface for securely attaching the connector device to another device such as a planar pad of a printed circuit board.

Wafer 300 offers several advantages over using a ball grid array type connector. First, the formation of the plurality of distinctly arranged solder balls is not a simple task and requires a significant amount of time and skill. Thus, ball grid array type connectors are usually costly because of the time and skill required to manufacture such connectors. In contrast, the wafer 300 of the present invention offers improved reliability with significantly lower manufacturing and raw material costs.

Figure 14:
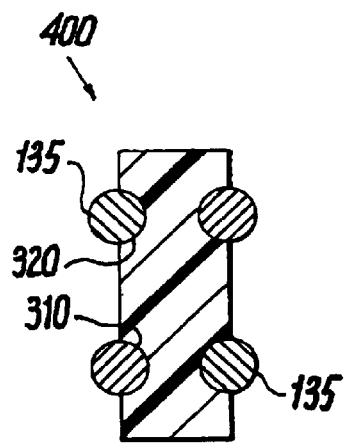
FIG. 14 is a side view of another exemplary wafer according to the present invention with solder lengths being provided on both sides thereof.

FIG. 14 illustrates yet another wafer 400 for use in soldering one electronic device to another electronic device. The wafer 400 is similar to the device 300 with the one difference being that the solder material is applied to both sides of the wafer 400. Thus, grooves 310 are formed on both sides of the wafer 400 so that solder segments 135 may be formed on both sides. This type of wafer 400 may be used to solder planar pads of one electronic device, such as a printed circuit board, or a ceramic wafer (not shown) to planar pads of another electronic device or other ceramic wafer (not shown). It is intended that the wafer 400 may be used in any type of connector environment where a surface mount connector is particularly suited for use.

Figure 15:
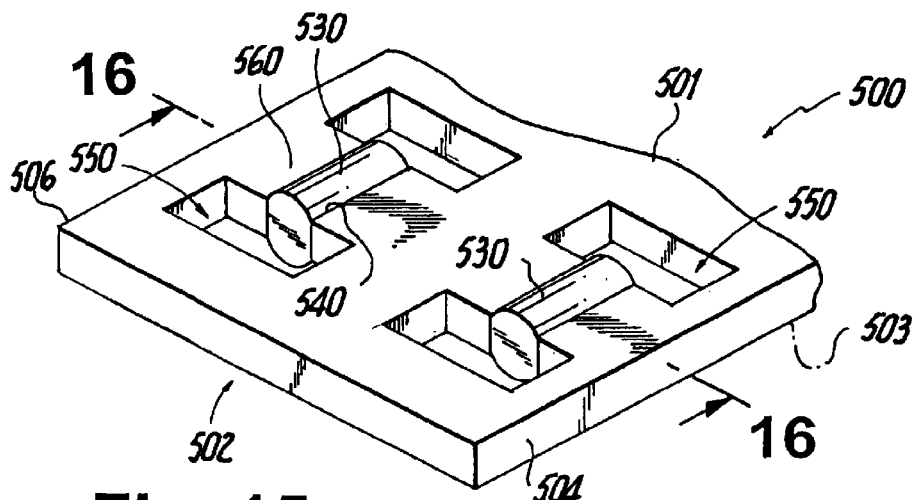
FIG. 15 is a side perspective view of a wafer according to another embodiment of the present invention.
Figure 16:
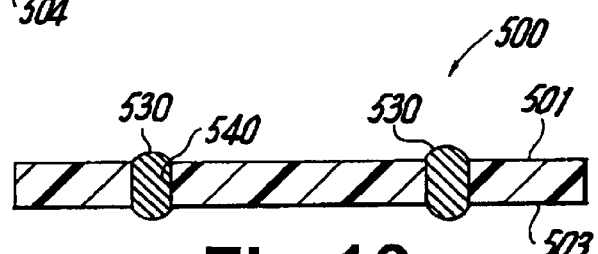
FIG. 16 is a cross section view taken along the line 16—16 of FIG. 15.
Figure 17:
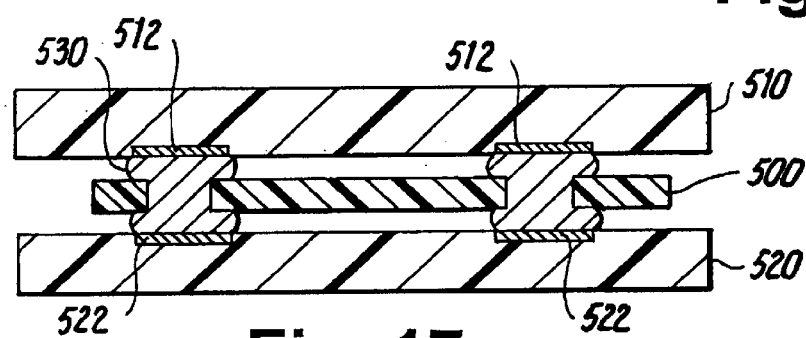
FIG. 17 is a side elevation view of the wafer of FIG. 15 being used to electrically connect a first electronic device to a second electronic device.

Turning now to FIGS. 15 through 17 in which yet another wafer according to another embodiment is shown and generally indicated at 500. As with the wafers of the other embodiments, the wafer 500 is preferably formed of a non-conductive material, such as a thermoset plastic or thermoplastic. In this embodiment, the wafer 500 is intended to be used in ball grid array type applications where a first generally planar electronic device 510 is electrically connected to a second generally planar electronic device 520. In one embodiment, the first generally planar electronic device 510 has at least one first contact 512 and the second electronic device 520 has at least one second contact 522. The first contact 512 may be in the form of a planar contact pad or the like or may be a solder ball in the case of a ball grid array type package. Similarly, the at least one second contact 522 may be in the form of a planar contact pad or the like or may be a solder ball. As is known, solder ball grid array type devices have a plurality of solder balls formed on a planar surface where each solder ball is associated with one contact terminal. The solder ball is then heated after the two electronic devices are positioned relative to one another to cause reflowing of the solder material to provide an electrical connection between the two contacts 512, 522.

FIG. 15 shows the wafer 500 in partial view. The wafer 500 generally includes a first end 502 and an opposing second end (not shown) along with a first side 504 and an opposing second side 506. The wafer 500 has one or more solder segments 530 disposed within the wafer 500 according to a predetermined pattern. Generally, there will be at least one solder segment 530 for each pair of electrical contacts 512, 522. In other words, one or more solder segments 530 are used to solder the one of the first contacts 512 to one of the second contacts 522 and provide an electrical connection therebetween. In the exemplary embodiment shown in FIG. 15, each solder segment 530 is fitted into a solder opening 540 formed in the wafer 500. The solder opening 540 extends completely through the wafer 500 so that the solder segment 530 preferably extends beyond both a first surface 501 and a second surface 503, as best shown in FIG. 16. This permits one solder segment 530 to be used to provide a solder connection between the first surface 501 and the first electronic device 510 and the second surface 503 and the second electronic device 520.

The wafer 500 also has a plurality of through holes 550 formed therein. The through holes 550 are arranged and formed in the wafer 500 such that one through hole 550 intersects one end of the solder opening 540 and another through hole 550 is formed at the opposite end of the solder opening 540 in an intersecting manner. Accordingly, the solder opening 540 opens into one through hole 550 at one end and the opposing through hole 550 at the other end. In one exemplary embodiment, each through hole 550 has a first axis extending along a length thereof and each solder opening 540 has a second axis extending along a length thereof. In the illustrated embodiment, the first and second axes are substantially perpendicular to one another. Each first axis is substantially parallel to the first end 502 and substantially perpendicular to the first and second sides 504, 506, respectively. Each second axis is therefore substantially parallel to the first and second sides 504, 506 and substantially perpendicular to the first end 502.

Because the solder opening 540 extends between two spaced through holes 550, opposing platforms 560 are formed and partially defined by the solder opening 540 and the through holes 550. FIG. 16 is a cross section view taken along a line 16—16 of FIG. 15 which cuts through the platforms 560. Thus, it will be appreciated that the edges of the platforms 560 serve to retain and hold the solder segment 530 therebetween within the solder opening 540. This design permits a single solder segment 530 to be used to provide a solder connection at opposing surfaces 501, 503 of the wafer 500. It will be appreciated that the number of solder segments 530 used and therefore the number of solder openings 540 and through holes 550 which are formed in the wafer 500 will typically depend upon the given application. More specifically and according to one embodiment, one solder segment 530 is used to provide both a solder and electrical connection between one first contact 512 and one second contact 522. Thus, if there are a multitude of first and second contacts 512, 522 provided on the respective first and second electronic devices 510, 520, there were will be a corresponding number of solder segments 530.

FIG. 17 illustrates the use of the wafer 500 in electrically connecting the first and second electronic devices 510, 520. Preferably, the dimensions of the wafer 500 are such that the wafer 500 is conveniently disposed between the first and second electronic devices 510, 520 without extending therebeyond. After disposing the wafer 500 between the first and second devices and aligning the first and second contacts 512, 522 relative to one another and then aligning each solder segment 530 relative to the first and second contacts 512, 522 such that the each solder segment 530 is in contact with or proximate to both of the first and second contacts 512, 522, the solder segments 530 are heated by known techniques. The heating of the solder material causes the solder material to reflow over both the first and second contacts 512, 522. Because the solder material comprises a conductive material, an electrical connection is provided from the first electrical device 510 to the second electrical device 520 through the first and second contacts 512, 522.

As with the other embodiments, the formation of the through holes 550 serves to define distinct segments of solder material which are used in the solder and electrical connection of one first contact 512 to one second contact 522. As previously-mentioned, this advantageously prevents a single mass of solder material from being formed during the solder operation and also prevents solder starvation sites from forming within the wafer 500.

The wafer 500 thus provides an attractive method of electrically connecting a first planar device (e.g., device 510) to a second planar device (e.g., device 520) where the wafer 500 is designed to be sandwiched between these devices 510, 520 yet at the same time provide electrical connections between corresponding electrical contacts. Not only does wafer 500 find particular utility in ball grid array type applications but also in applications where one planar printed circuit board is electrically connected to another printed circuit board. It will be appreciated that the shapes and sizes of the solder segments 530, the solder opening 540, and the through holes 550 may vary according to the given application and are not critical to the practice of the present invention. Broadly, the wafer 500 comprises a member in which a single solder segment disposed therein serves to electrically connect the first device 510 disposed against the first surface 501 of the wafer to the second device 520 disposed against the second surface 503.

Figure 18:
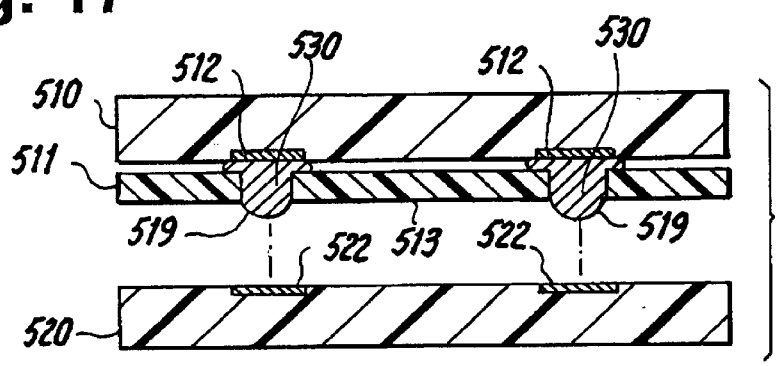
FIG. 18 is a cross section side view of a connector according to another embodiment of the present invention.

Turning now to FIG. 18 in which yet another embodiment of the present invention is illustrated. In the embodiment of FIG. 18, the solder-bearing features of the wafer 500 are incorporated into the first electronic device 510. A solder-bearing member 511 forms a part of the first electronic device 510 such that one or more solder segments 530 are aligned with one first contact 512 of the first electronic device 510. Similar to the wafer 500, the solder segments 530 are disposed within solder openings 540 and extend completely through the solder-bearing member 511 so as to be accessible to both opposing surfaces of the solder-bearing member 511. It will be appreciated that the solder-bearing member 511 may be a separate member such as the wafer 500 which is securely attached to the first electronic device 510 or the solder-bearing member 511 may be integrally formed with the first electronic device 510. In both instances, the solder-bearing member 511 is preferably formed of a non-conductive material such as a thermoplastic or thermoset plastic.

In this embodiment, the one or more solder segments 530 provide an electrical pathway to one first contact 512. Each solder segment 530 includes a first portion 517 which is disposed in intimate contact with or proximate to the first contact 512 and a second portion 519 which is formed on the opposite side of the solder-bearing member 511. The second portion 519 is thus designed for positioning relative to the second contact 522 to form an electrical and solder connection therewith upon heating. By depositing one or more solder segments 530 over each first contact 512, the first electronic device 510 may be easily electrically connected to the second electronic device 520 by positioning the first electronic device 510 relative to the second electronic device 520 such that the second portions 519 are aligned with the second contacts 522. The second portions 519 may be in intimate contact with or proximate to the second contacts 522 when the first and second electronic devices 510, 520 are positioned and coupled to one another. Upon heating, the solder segments 530 reflow and provide the desired electrical connection between the first and second contacts 512, 522. More specifically, the first portion 517 reflows over the first contact 512 and the second portion 519 reflows over the second contact 522.

Various embodiments of the present invention thus provides a wafer designed to carry solder material, whereupon heating and placement of the wafer relative to the first and second electronic devices, the solder material acts to securely attach a first contact of the first electronic device to a second contact of the second electronic device. Advantageously, the wafer may be used in a variety of settings including through hole electronic devices and also surface mount applications. The wafer has a simple yet effective design with increased application potential relative to conventional connecting devices.

Although a preferred embodiment has been disclosed for illustrative purposes, those skilled in the art will appreciate that many additions, modifications and substitutions are possible without departing from the scope and spirit of the invention.

What is claimed is:

1. A solder-bearing wafer for use in electrically connecting at least one first contact of a first electronic device with at least one second contact of a second electronic device, the wafer comprising:
    a substrate body having a first surface and an opposing second surface, the first surface having at least one groove formed therein, the substrate body for placement between the first and second electronic devices; and
    at least one length of solder material disposed within the at least one groove, whereupon heating of the at least length of solder material and placement of the substrate body between the first and second electronic devices causes the at least one first contact to be securely and electrically connected to the at least one second contact.

2. The solder-bearing wafer as in claim 1, wherein the second electronic device comprises a through hole device having at least one first opening for receiving the at least one first contact which is in the form of a conductive pin, the substrate body having at least one second opening for receiving the at least one first contact, the at least one length of solder material disposed adjacent the at least one second opening.

3. The solder-bearing wafer as in claim 1, wherein the second surface includes at least one second groove formed therein and at least one second length of solder material is disposed within the at least one second groove.

4. The solder-bearing wafer as in claim 1, wherein the at least one length of solder material is partitioned into a plurality of solder segments, each solder segment for electrically connecting one first contact to one second contact.

5. The solder-bearing wafer as in claim 4, wherein the substrate body has a plurality of through holes formed therethrough within the at least one groove, each solder segment disposed between adjacent through holes.

6. The solder-bearing wafer as in claim 1, wherein the substrate body is formed of a non-conductive material.

7. A solder-bearing wafer for use with a through hole device, the wafer comprising:
    a substrate body having a first surface and an opposing second surface;
    a plurality of first openings formed through the substrate body for receiving first electrical contacts of a first electrode device;
    a plurality of segments of solder material coupled to the first surface of the substrate body, each first opening having one or more solder segments disposed thereabout for forming a solder connection between the first electrical contact of the first electronic device and the through hole device when the solder segments are heated and
    a plurality of grooves formed in the first surface of the substrate body, each groove having a cross-section which is complementary to a cross-section of the solder segment so that each solder segment to securely and intimately fitted within one groove.

8. The solder-bearing wafer as in claim 7, wherein the first openings are formed in longitudinal rows along a length of the substrate body.

9. The solder-bearing wafer as in claim 7, further including:
    a plurality of through holes formed in the substrate body, the plurality of through holes being arranged on the substrate body so that the through holes are arranged in rows with at least one through hole being formed on either side of each pin hole.

10. The solder-bearing wafer as in claim 7, wherein each groove extends longitudinally across the substrate body, the groove having an annular cross-section.

11. The solder-bearing wafer as in claim 7, wherein a pair of the grooves are formed on either side of a row containing a plurality of the first openings which are formed along a common axis.

12. The solder-bearing wafer as in claim 7, further including:
    a plurality of through holes formed in the substrate body, the plurality of through holes being arranged on the substrate body so that along a first axis containing a row of through holes at least one through hole is formed on either side of each first opening, each through hole extending sufficiently along a second axis so as to encompass one or more of the grooves.

13. The solder-bearing wafer as in claim 12, wherein two through holes are formed surrounding one first opening.

14. The solder-bearing wafer as in claim 12, wherein the second axis is substantially perpendicular to the first axis.

15. The solder-bearing wafer as in claim 12, wherein the through holes divide each groove into a plurality of groove segments, each groove segment extending between a pair of through holes.

16. The solder-bearing wafer as in claim 12, wherein one solder segment is disposed within one of the groove segments.

17. The solder-bearing wafer as in claim 7, wherein the substrate body is formed of a non-conductive material.

18. A solder-bearing wafer for use with a through hole device, the wafer comprising:
    a substrate body having a first surface and an opposing second surface;
    a plurality of first openings formed through the substrate body for receiving first electrical contacts of a first electronic device;
    a plurality of grooves formed in the substrate body such that the first opening has a first groove formed on a first side thereof and a second groove formed on a second side thereof;

a plurality of through holes formed in the substrate body, the through holes being spaced so that each through hole intersects the first and second grooves with one first opening being formed between two adjacent through holes, the trough holes serving to partition the groove into groove segments; and a plurality of segments of solder material, each solder segment disposed within one groove segment so that each first opening has one solder segment proximate to the first side thereof and another solder segment proximate to the second side thereof for forming a solder connection between the fist electrical contacts of the first electronic device and the through hole device.

19. An electrical connector for electrical connection to a second electronic device having at least one second contact, the electrical connector comprising:

a body having a first surface including at least one first contact, the body having at least one groove formed in the first surface proximate the at least one first contact; and at least one length of solder material retainingly disposed within the at least one groove, the first surface for placement against the second electronic device such that the first and second contacts are aligned and whereupon heating of the at least length of solder material, the first and second contacts are securely attached to one another and form an electrical pathway there between.

20. The electrical connector of claim 19, wherein the body includes a plurality of partitioned grooves, each groove receiving one length of solder material, the partitioned grooves being formed so that one first contact is formed between two grooves so that the solder material disposed within the two grooves is used for electrically the one first contact to one second contact.

21. The electrical connector of claim 19, wherein the first contact comprises a contact selected from the group consisting of a pin contact and a planar contact.

22. A solder-bearing wafer for use in electrically connecting at least one first contact of a first electronic device in at least one second contact of a second electronic device, the wafer comprising:

a substrate body having a first surface and an opposing second surface,
  at least one segment of solder material retainingly disposed within a solder opening formed in the substrate body, the at least one solder segment being accessible from both the first and second surfaces of the substrate body, the substrate body for positioning between the first and second devices such that the at least one solder segment provides a soldered electrical connection between the at least one first contact and the least one second contact upon heating of the at least one solder segment; and
  a plurality of through holes formed in the substrate body, each solder opening extending between two spacial through holes such that that the solder opening opens into each of the through holes.

23. The wafer as in claim 22, wherein the first and second electronic devices each comprise a substantially planar electronic device and the first and second surfaces of the substrate body are substantially planar.

24. The wafer as in claim 22, wherein each of the first and second electronic devices comprises a device selected from the group consisting of a ball grid array type device and a printed circuit board.

25. The wafer as in claim 22, wherein each of the first and second contacts comprises a contact selected from the group consisting of a planar contact and a solder ball.

26. The wafer as in claim 22, wherein the substrate body is formed of a non-conductive material.

27. A method of electrically connecting a first contact of a first electronic device to a second contact of a second electronic device, the method comprising:

providing a wafer having a first surface and an opposing second surface;

forming at least one groove within the first surface;

disposing a length of solder material within the at least one groove so that the length of solder material is retained within the at least one groove;

positioning the first electronic device relative to the wafer so that the length of solder material is aligned with the first contact;

positioning the second electronic device relative to the wafer and the first electronic device so that the first and second contacts are aligned with the wafer being positioned therebetween; and heating the length of solder material so that a secure solder connection and electrical pathway are formed between the first contact and the second contact.

28. The method as in claim 27, further including:

forming at least one first opening within the wafer for receiving the first contact, wherein the second electronic device includes at least one through hole for receiving the first contact.

29. The method as in claim 27, further including:

partitioning the length of solder material into a plurality of solder segments by forming at least one through hole within the wafer, the at least one through hole at least partially encompassing the at least one groove so that the length of solder material disposed therein is partitioned.

30. The method as in claim 29, further including:

forming a second groove substantially parallel to the at least one groove, the second groove containing a second length of solder material, the at least one through hole comprising a plurality of through holes extending between and at least partially encompassing the first and second grooves such that the first and second lengths of solder material are partitioned into a plurality of solder segments, each first contact being electrically connected to one second contact by at least two solder segments.

* * * * *